United States Patent [19]
Goodrich

[11] Patent Number: 5,162,696
[45] Date of Patent: Nov. 10, 1992

[54] FLEXIBLE INCASEMENTS FOR LED DISPLAY PANELS

[76] Inventor: Frederick S. Goodrich, 9 Apple Orchard Rd., Rochester, N.H. 03867

[21] Appl. No.: 609,756

[22] Filed: Nov. 7, 1990

[51] Int. Cl.⁵ .................. H05B 33/02; G09F 13/22
[52] U.S. Cl. ................................ 313/511; 40/544; 40/597; 362/800; 362/812
[58] Field of Search .............. 313/511, 512; 362/800, 362/812, 806; 40/597, 544; 340/782, 786

[56] References Cited
U.S. PATENT DOCUMENTS

| | | | |
|---|---|---|---|
| 4,713,579 | 12/1987 | Miura | 313/511 X |
| 4,774,434 | 9/1988 | Bennion | 313/511 X |
| 4,860,476 | 8/1989 | Hall | 40/597 X |

*Primary Examiner*—Sandra L. O'Shea

[57] ABSTRACT

The preferred embodiment of the present invention is an outer light transmissive envelope consisting of transparent rubber-like polyvinyl chloride (PVC) containing light emitting diode (LED) display panels comprised of a plurality of LED elements arranged in matrix formation. Aforementioned apparatus will have flexibility characteristics giving it the ability to conform to curved vertical surfaces that are flat and non-porous. Suction cup devices made of PVC will be bonded to the light transmissive envelope thus enabling the LED apparatus to be attached to vertical surfaces, making the unit self-supporting.

5 Claims, 1 Drawing Sheet

FLEXIBLE INCASEMENTS FOR LED DISPLAY PANELS

BACKGROUND OF THE INVENTION

This invention relates to light emitting diode (LED) display panels composed of a plurality of light emitting diode elements. The inventor purports to introduce a new way to enclose LED display mechanisms of all sorts, but the preferred embodiment relates to LED moving message display signs. More specifically, the present invention plans to utilize polyvinyl chloride (PVC) to enclose said LED signs. Using PVC as a medium to incase LED components will promote flexibility to the heretofore traditionally rigid incasements of LED display sign mechanisms. The inventor believes that this flexible feature will enable the introduction of new industrial uses for LED moving message display signs.

LED technology has been in existance for many years. And although the present invention incorporates the use of LED mechanisms, it is not the intent of the inventor to become involved with any of the technical aspects of LED mechanisms. Instead, it is the intent of the inventor to focus entirely on the PVC incasement medium that will be used to enclose the LED mechanism. To date, manufacturers of LED moving message display signs have not deviated from traditional methods of incasing LED components. That is, LED mechanisms are enclosed in straight and rigid containers that are neither flexible nor self-supporting. The inventor now introduces the use of PVC as a new incasement medium which will be both flexible and self-supporting. Notwithstanding additional research and development on those LED components being incased that may be necessitated in order to produce the desired properties and dimensions envisioned by the present invention, the inventor wishes to promulgate his new invention at this time. Through the use of transparent, rubber-like PVC to incase LED sign system components, the flexible PVC material will allow the LED sign to conform to vertical surfaces that are flat, non-porous curved or straight. Built-in suction cups will enable the LED apparatus to be attached to these vertical surfaces and thus be self-supporting. There is no known LED moving message display sign system which has the ability of being self-supporting and having the capability of bending in order to conform to curved surfaces.

SUMMARY OF THE INVENTION

The present invention relates to LED mechanisms such as but not limited to those used in the manufacture of LED moving message display signs. The inventor is promulgating the use of transparent, rubber-like PVC to incase LED components in order to make the LED apparatus flexible enough so that it will be able to conform to curved surfaces and at the same time be self-supporting through the use of built-in suction cups. Said suction cup devices are attached to the aforementioned envelope by a bonding process or stamped into said envelope during the manufacturing process. The LED display elements may be configured to emit a single color or a combination of colors.

DETAILED DESCRIPTION OF THE INVENTION

Figure 1:
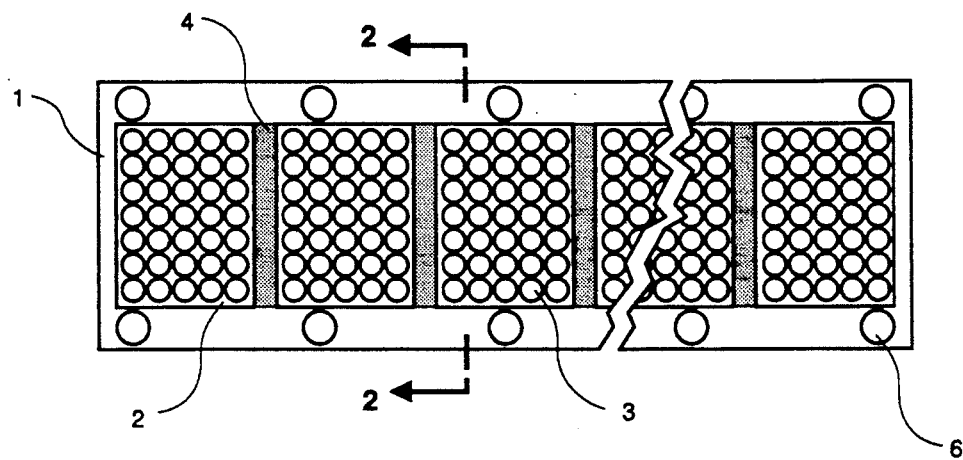
FIG. 1 illustrates the front view of the preferred embodiment of the invention, which is an LED moving message display apparatus.
Figure 2:
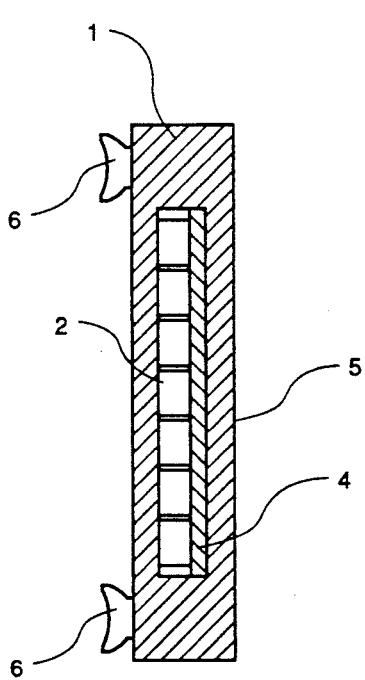
FIG. 2 shows an end view of the same apparatus illustrated in FIG. 1. This drawing depicts the approximate proportionate dimensions of the PVC incasement medium compared to the LED components being incased.
Figure 3:
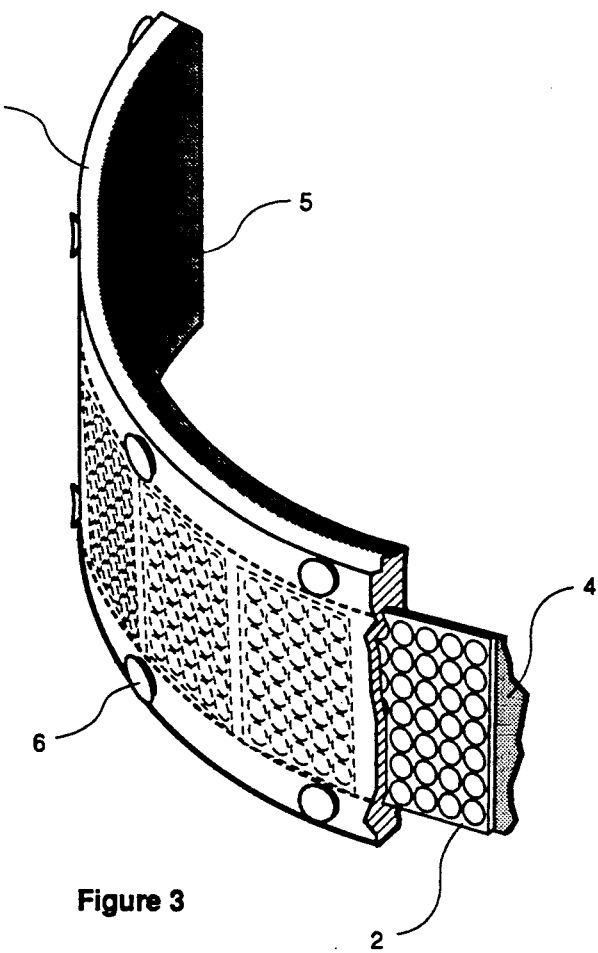
FIG. 3 is a three dimensional drawing illustrating the flexible characteristics of the PVC material used to incase the LED mechanism.

The preferred embodiment of the LED moving message display apparatus is typically controlled by a wireless handheld keyboard. The operator who holds the programmable keyboard is able to input a message into the handheld keyboard computer which is then subsequently transmitted to the LED display apparatus. The programmed message will then activate the LED elements and flow across the LED apparatus. The message usually repeats itself indefinitely until a new message is prepared or the unit is turned off.

Figures one through three illustrate a light emitting diode (LED) moving message display apparatus enclosed in an outer light transmissive envelope 1. This outer envelope consists of a transparent, rubber-like polyvinyl chloride (PVC) that is heat resistant and flexible according to the present invention. The LED apparatus is comprised of a series of LED display panels 2 composed of a plurality of light emitting diode elements 3 arranged on a flexible substrate 4 in a matrix formation. To provide a contrast to the bright light produced by the LED elements, the back side of the PVC incasement medium 5 is an opaque color which will provide a dark enough background and thereby improve the viewing characteristics of the display apparatus in general. Said outer envelope 1 will have suction cup devices 6 also made of PVC and mounted on the surface of said envelope. The purpose of the suction cups is to enable the entire unit to be attached to vertical surfaces and thereby be self-supporting.

The foregoing description of a preferred embodiment of the invention has been presented for purposes of illustration and description. It is not intended to be exhaustive or to limit the invention to the precise form disclosed and many modifications and variations are possible in light of the above teaching. For example FIG. 1 is not intended to limit the shape or proportionate size of the preferred embodiment of the present invention.

What is claimed is:

1. A display panel comprising an outer light transmissive envelope having several light emitting diode panels are composed of a matrix of light emitting diode elements arranged on a flexible substrate, a plurality of suction cup devices are mounted on said outer envelope so that said display panel will be self-supporting and, said outer envelope and said plurality of suction cup devices are composed of a transparent, rubber-like polyvinyl chloride (PVC) which is heat resistant and flexible.

2. The display panel of claim 1 wherein said outer light transmissive envelope is not limited to any certain size, configuration or dimension.

3. The display panel of claim 1 wherein the design of the suction cup devices used to make the unit self-supporting are mounted onto the outer light transmissive envelope or incorporated into the body of said envelope by a stamping process of said envelope.

4. The display panel of claim 1 wherein the light emitting diode elements emit the same color.

5. The display panel of claim 1 wherein the light emitting diode elements emit any combination of colors.

* * * * *